US005118938A

United States Patent [19]

Kondow et al.

[11] Patent Number: 5,118,938

[45] Date of Patent: Jun. 2, 1992

[54] RYDBERG ATOM IMPACT TYPE ION SOURCE

[75] Inventors: Tamotsu Kondow, 1-3-17-609, Etchujima, Koto-ku, Tokyo; Takashi Nagata, Tokyo; Yutaka Yamamoto, Kanagawa, all of Japan

[73] Assignees: Nippon Oil Company, Limited; Tamotsu Kondow, Tokyo, Japan

[21] Appl. No.: 631,330

[22] Filed: Dec. 20, 1990

[30] Foreign Application Priority Data

Dec. 20, 1989 [JP] Japan ................................ 1-328370
Dec. 22, 1989 [JP] Japan ................................ 1-331145

[51] Int. Cl.[5] ............................................ H01J 37/08

[52] U.S. Cl. ............................... 250/288; 250/423 R; 250/427

[58] Field of Search .................. 250/288, 423 R, 424, 250/426, 427

[56] References Cited

PUBLICATIONS

McGraw-Hill, *Dictionary of Scientific and Technical Terms*, Fourth Edition p. 1649.

*Van Nostand's Scientific Encyclopedia*, Seventh Edition, p. 2491.

M. Matsuzawa, *Rydberg States of Atoms and Molecules*, eds. R. F. Stebbings and F. B. Dunning (Cambridge University Press, N.Y., 1983), p. 267.

B. G. Zolars et al., *Phys. Rev.*, A 32, 3330 (1985).

T. Kondow, *J. Phys. Chem.*, 91, 1307 (1987).

*Primary Examiner*—Jack I. Berman
*Assistant Examiner*—Kiet T. Nguyen
*Attorney, Agent, or Firm*—Scully, Scott, Murphy & Presser

[57] ABSTRACT

Provided is a Rydberg atom impact type ion source in a mass spectrometric apparatus wherein gaseous sample molecule is impinged on Rydberg atom to ionize the sample and thus-ionized sample is subjected to mass spectrometric analysis, said ion source being characterized in that a needle rod-like grid is used in a Rydberg atom generating portion of an ion source block.

4 Claims, 6 Drawing Sheets

RYDBERG ATOM IMPACT TYPE ION SOURCE

BACKGROUND OF THE INVENTION

The present invention relates to an ion source in a mass spectrometric apparatus in which a sample molecule is impinged on Rydberg atom and thereby ionized negatively for mass spectrometric analysis. More particularly, the present invention is concerned with an ion source capable of producing Rydberg atoms stably and making negative ions of a sample produced by impingement on Rydberg atoms present in a stable state.

Recently, necessity has been increasing for analyzing, in a simple manner and that in high sensitivity, trace amounts of chemical substances having high molecular weights and complicated structures such as very small amounts of active substances in life, living body components, trace amounts of active substances, e.g. perfumes and offensive smell, medical substances, including vitamins, a wide variety of food additives and oil, fat antioxidants. Mass spectrometric analysis is the simplest and most economical method for analyzing these substances quickly and in high sensitivity.

In mass spectrometric analysis it is necessary to ionize a sample. Generally, a gaseous sample of a molecular compound is ionized by using electron beam (e.g. 70 V), proton, or ion beam. According to this method, the possibility of formation of cation is $10^4$ times that of anion, and the energy given to a sample molecule by electron impact is much larger than the amount thereof required for ionization or for bond rupture. Consequently, the ionization is followed by fragmentation and further secondary ionic molecular reactions and the complicated spectrum is obtained.

As a result, information on the parent molecule which is important particularly in analyzing the results is apt to be uncertain. In order to suppress such secondary processes upon ionization, there have been developed several methods such as techniques of field elimination ionization and high-speed atomic impingement ionization. Even these methods can be completely avoid the deterioration of a sample having a high molecular weight, extraction of information of the molecular weight and abundance of the sample molecules necessitate a complicated analysis of the decomposed ions.

For solving these problems, we have developed a method wherein a gaseous sample molecule is negatively charged by collision units, Rydberg atoms and the ions thus produced are subjected to mass spectrometric analysis. In the method used so far, wherein a gaseous sample molecule is allowed to collide with Rydberg atoms and the ions produced are sent to a mass spectrometer, the filament-grid distance is so small (see FIG. 3) that an impurity atom (e.g. tungsten atom) sputtered from the filament is vapor-deposited on the grid and discharge occurs. Repeated discharge interrupts the measurements and causes the filament burnt out. In the method in question, thermalelectrons from the filament are accelerated and collisionally excite a rare gas (e.g. xenon) into Rydberg states (Rydberg atom).

However, the density of the Rydberg atom thus produced is low because of the low current density of electrons in the vicinity of the grid. Further, the sample molecule is thermally decomposed on the wall which is heated by the hot filaments; there occurs decomposition of the molecular ions produced; the production efficiency of negative ions of the parent molecule in the sample by impact of the Rydberg atoms is deteriorated; and the spectrum obtained is very complicated, and is difficult, or as the case may be impossible, to be analyzed.

It is the object of the present invention to provide an ion source by use of Rydberg atoms impact, which is capable of overcoming the above-mentioned problems, generating Rydberg atoms stably, and producing negative ions in collision with Rydberg atoms present in a stabilized state.

SUMMARY OF THE INVENTION

The present invention relates to an ion source in a mass spectrometric apparatus wherein a gaseous sample molecule is allowed to collide with Rydberg atoms so as to ionize the sample molecule and the sample molecule thus ionized is subjected to mass spectrometric analysis, the ion source being characterized in that needle rod-like electrode is used in a Rydberg atom generation portion in an ion source block, and preferably the ion source block is equipped with cooling means.

According to the present invention, since a needle rod type electrode is mounted in the ion source block of a Rydberg atom impact type, there no longer occurs the electrode discharge which causes the vapor deposition of atoms sputtered from a filament; further, the density of thermalelectrons in the vicinity of the electrode increased according to the density of the Rydberg atoms produced increased. Beside, by providing the ion source block with cooling means, the temperature increase of the ion source block is suppressed and thereby the parent molecular ion is produced more efficiently and stably according to the suppress of the sample decomposition on the hot wall of the block.

Figure 1:
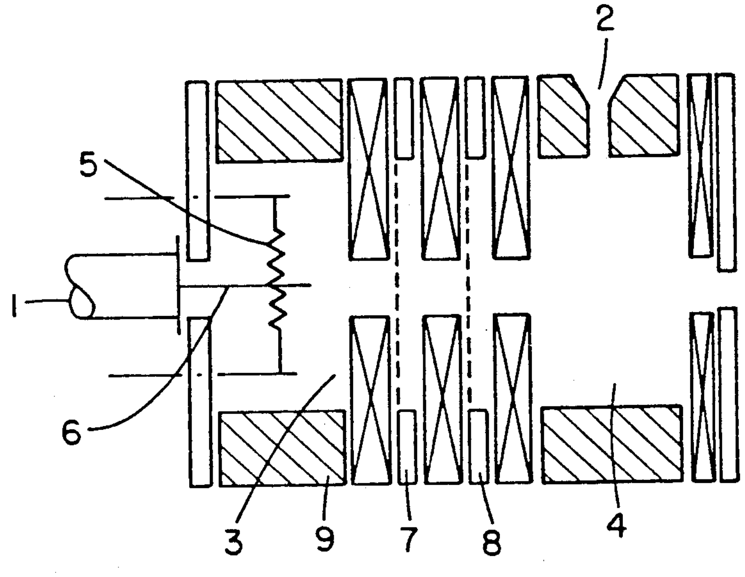
FIG. 1 is a sectional view showing the constructions of a Rydberg atom impact type ion source block according to an embodiment of the present invention.
Figure 2:
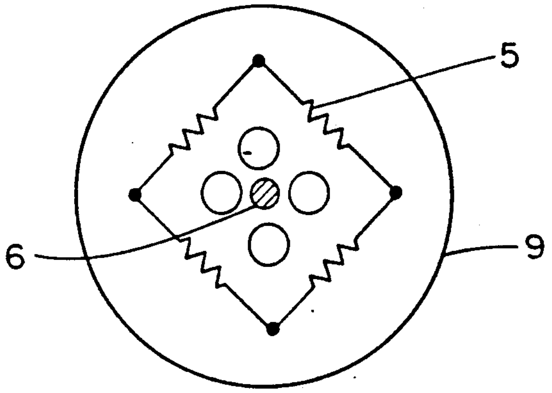
FIG. 2 is a front view thereof.

1,1'. . . rare gas inlets
2,2'. . . sample inlets
3,3'. . . Rydberg atom generating chambers
4,4'. . . sample ionization chambers
5,5'. . . filaments
6,6'. . . positively charged grids
7,7',8,8'. . . negatively charged grids
9,9'. . . cooling coils
10,10'. . . chambers

DETAILED DESCRIPTION OF THE INVENTION

The present invention is described with reference to the figures.

FIG. 1 is a sectional view showing the construction of a Rydberg atom impact (RAI) type ion source block according to an embodiment of the present invention. The RAI ion source block is composed of two small chambers, with two grids 7 and 8 being disposed in intermediate positions. Thermalelectrons emitted from filament 5 are collected by a needle rod-like electrode 6 positively biased. Grids 7 and 8 are both biased negatively to prevent thermalelectrons from flowing into ionization chamber 4.

Rare gas atoms (e.g. xenon) introduced through gas inlet 1 are excited by impact of electrons present in the region near grid 6. The Rydberg atoms thus produced are allowed to collide with sample molecules introduced from sample inlet 2 and thereby ionizes the sample molecules negatively. In this process, the block of the ion source is heated by the filament and the temperature of the block of the ion source usually reaches 300–400° C. The block is cooled by cooling means 9 mounted outside the block, and the temperature of the ionization chamber 4 is dropped usually to 150° C. or less, preferably 40–70° C.

The cooling means is disposed outside a Rydberg atom generating chamber 3. If only its position is outside the Rydberg atom generating chamber, the cooling means may be disposed outside the ionization chamber 4, that is, outside the entire ion source block, as illustrated.

The cooling method is not specially limited. There may be adopted a cold air blowing method. But preferably there is adopted a method in which cooling is effected by passing a refrigerant through a hollow conduit. The refrigerant to be used is not specially limited if only it is a fluid such as liquid or gas capable of exhibiting a cooling action. Examples are water, oils, organic solvents, as they are or in a cooled state using ice or dry ice, as well as liquid nitrogen and cooled air.

Figure 3:
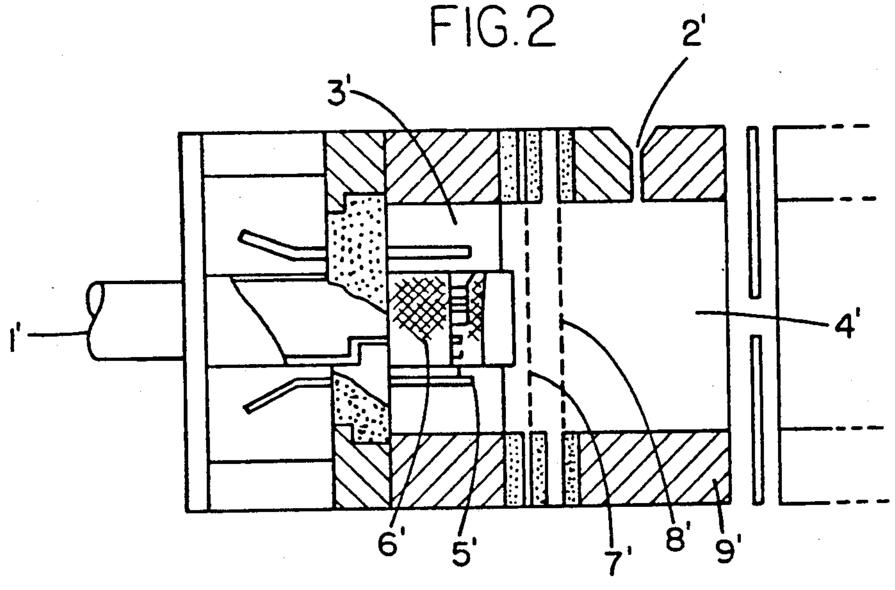
FIG. 3 is a sectional view showing the construction of a conventional ion source block.

FIG. 3 is a sectional view showing the construction of a conventional ion source block. A conventional grid 6' is in the shape of a wire gauze, so once atoms emitted from a filament are vapor-deposited on the wire gauze, the elective discharge takes place between the filament, indicated at 5' and grid 6'. Further, the temperature of the ion source block rises due to heat generated in the formation of Rydberg atoms, thereby causing decomposition of a sample molecule and that of molecular ions produced. On the other hand, in the present invention, because of using the needle rod-like grid 6, the space between the grid 6 and the filament 5 is expanded to eliminate the discharge phenomenon and it becomes possible to move and trap the thermoelectrons emitted from the filament smoothly to the grid 6. Further, since the cooling means 9 is provided, the increase of the ion source block temperature is suppressed and the production efficiency of negative ions of a sample parent molecule is improved; further, the negative ions can be held in a stabilized state.

Suitable examples of the material of the needle rod-like grid used in the present invention are stainless steel, tantalum, molybdenum, tungsten and nickel, each alone or as an alloy comprising two or more thereof. The diameter of the needle rod may be set suitably, but usually it is in the range of 0.1 to 10 mm, preferably 0.2 to 5 mm.

According to the present invention, the discharge phenomenon which has been a drawback of the conventional methods can be suppressed and Rydberg atoms can be produced stably and hence it is possible to produce negative ions of a sample in a stable state, whereby there can be easily obtained a spectrum of the said negative ions capable of being analyzed in the measurement of a sample which has been either incapable of being detected or difficult to be analyzed in the conventional method. Further, the ion source of the present invention can be reduced in size and mounted to commercially available mass spectrometric apparatus, thus affording high versatility.

EXAMPLES

The following examples are given to illustrate the present invention more concretely.

EXAMPLE 1

A total ion chromatogram of benztriazole was measured using a mass spectrometric apparatus equipped with the RAI type ion source of the present invention shown in FIG. 1, equipped cooling coils 9, 9' were not equipped. The analysis was made under the following conditions:

| | |
|---|---|
| Grid ($G_1$) | 100 V |
| Grid ($G_2$) | −100 V |
| Grid ($G_3$) | −300 V |
| Filament Current | 7.5 A |
| Chamber | 100 V |

A needle rod with a diameter of 2 mm made of stainless steel was used. The results obtained are as shown in FIG. 4.

Figure 5:
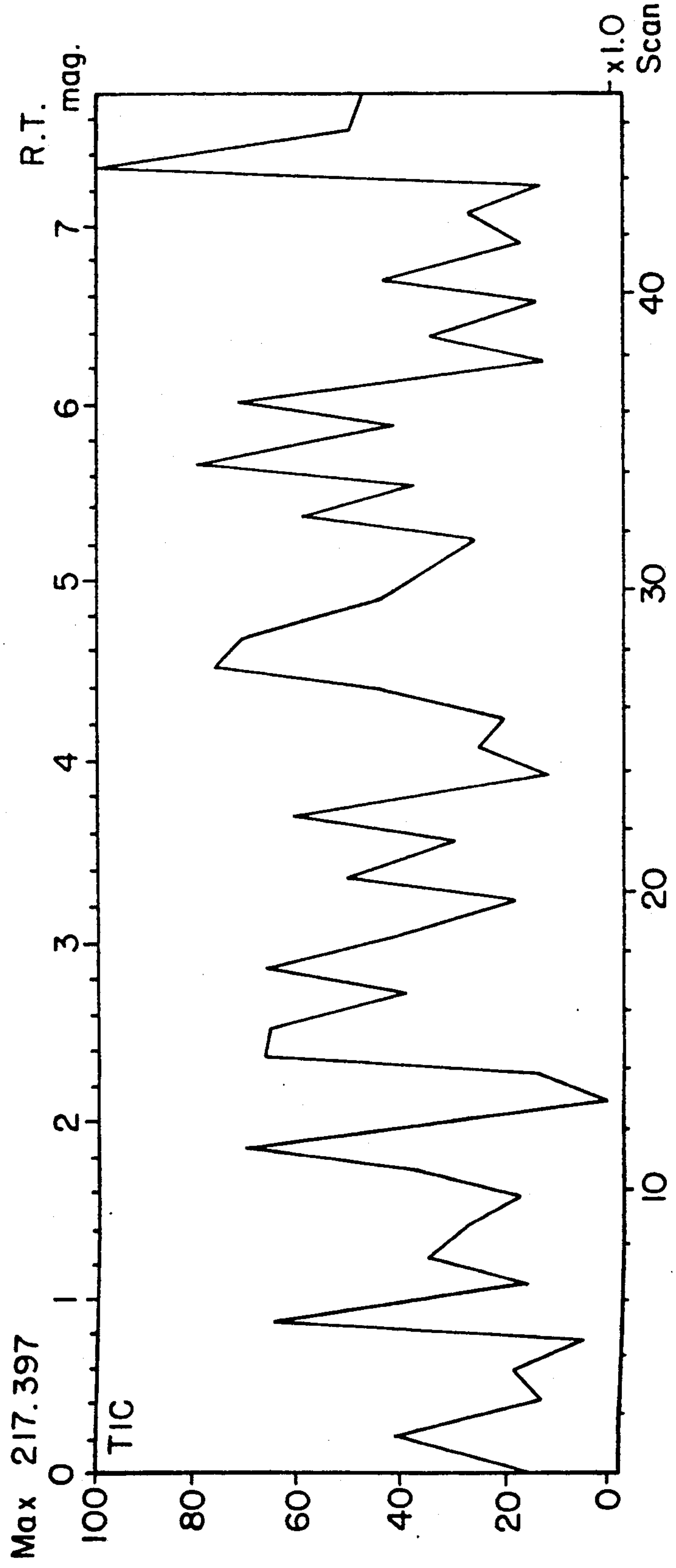

On the other hand, using the conventional mass spectrometric apparatus shown in FIG. 3, the same measurement was made under the same conditions as above. FIG. 5 shows the results obtained.

Figure 4:
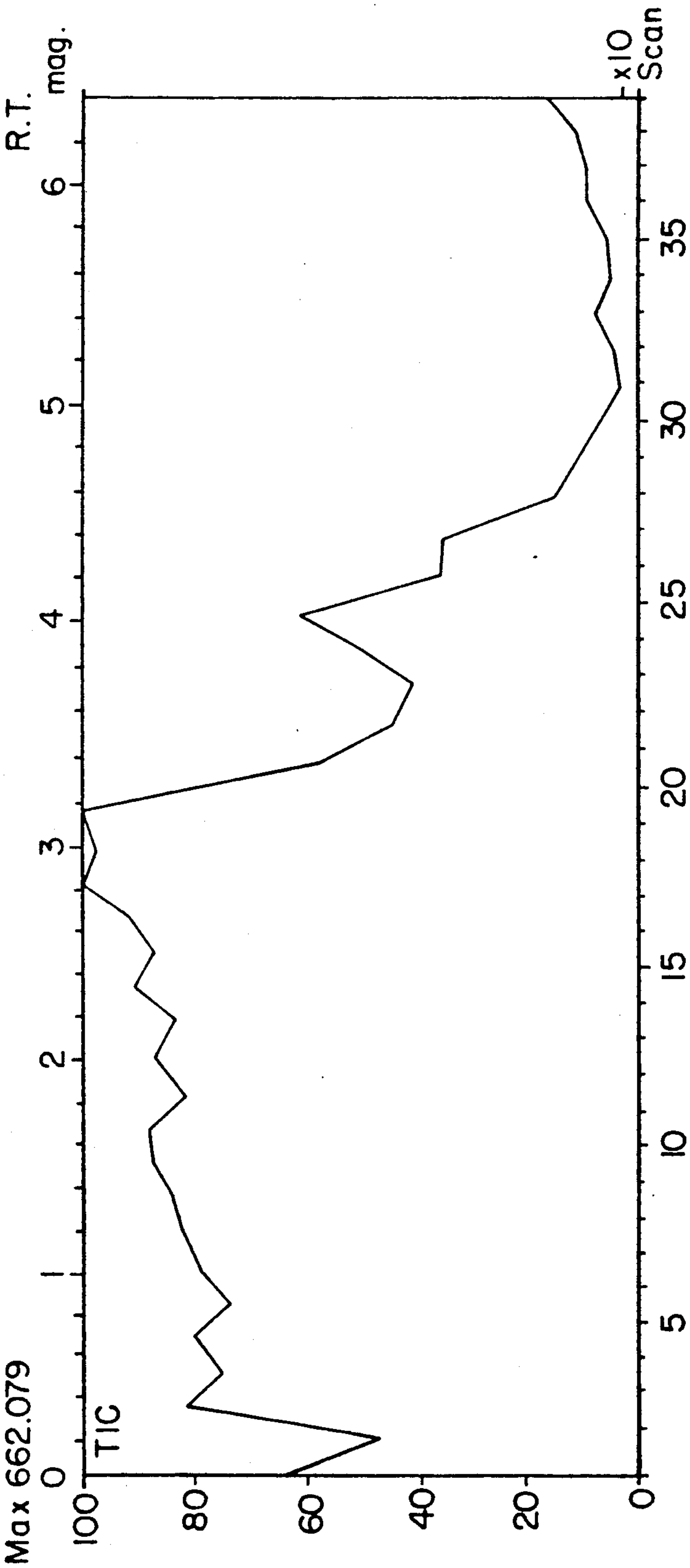
FIGS. 4 and 5 illustrate a total ion chromatogram of benztriazole.

As is apparent from FIG. 4, negative ions are produced at a high level and in a very stable state according to the present invention, while in the total ion chromatogram according to the conventional method shown in FIG. 5, the formation of negative ions is unstable, and it is apparent that due to frequent and repeated discharge of electricity, the amount of negative ions decreases markedly at every such discharge.

EXAMPLE 2

Under the following conditions, a spectrum of benztriazole was measured using a mass spectrometric apparatus equipped with the RAI type ion source of the present invention shown in FIG. 1:

| | |
|---|---|
| Grid ($G_1$) | 100 V |
| Grid ($G_2$) | −100 V |
| Grid ($G_3$) | −300 V |
| Filament Current | 7.5 A |
| Chamber | 100 V |

Figure 6A:
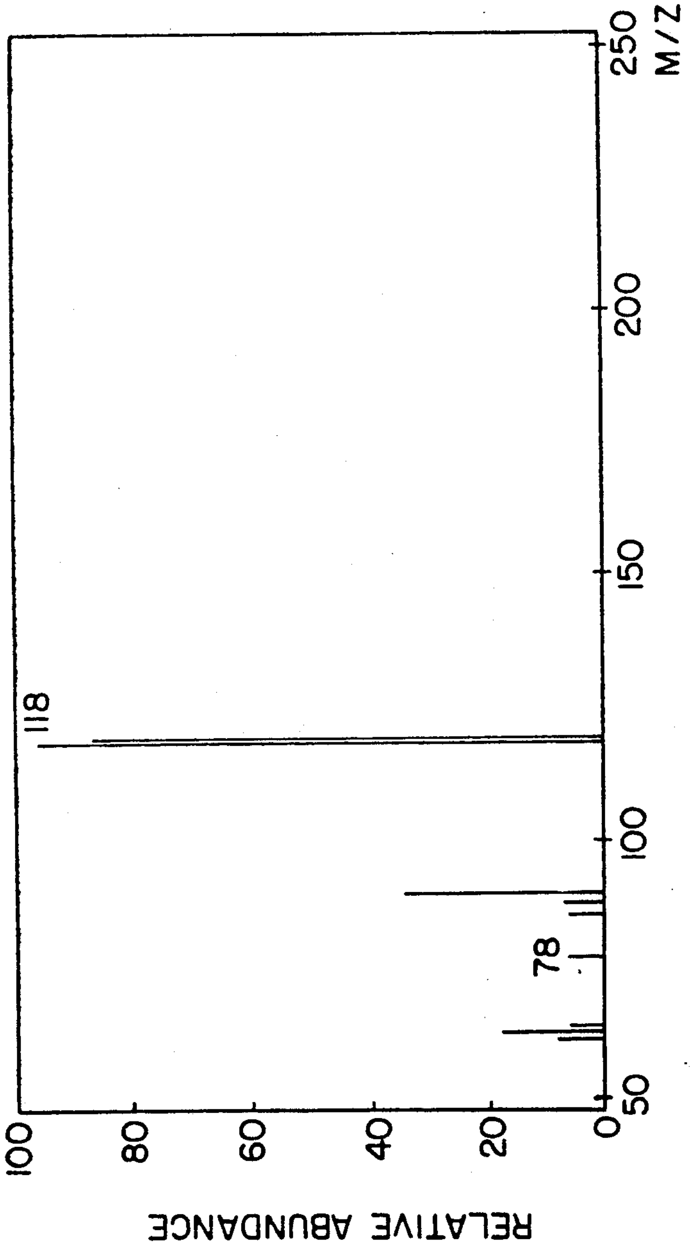
FIG. 6(*a*) and (*b*) are mass spectrometric diagrams of benztriazole.
Figure 6B:
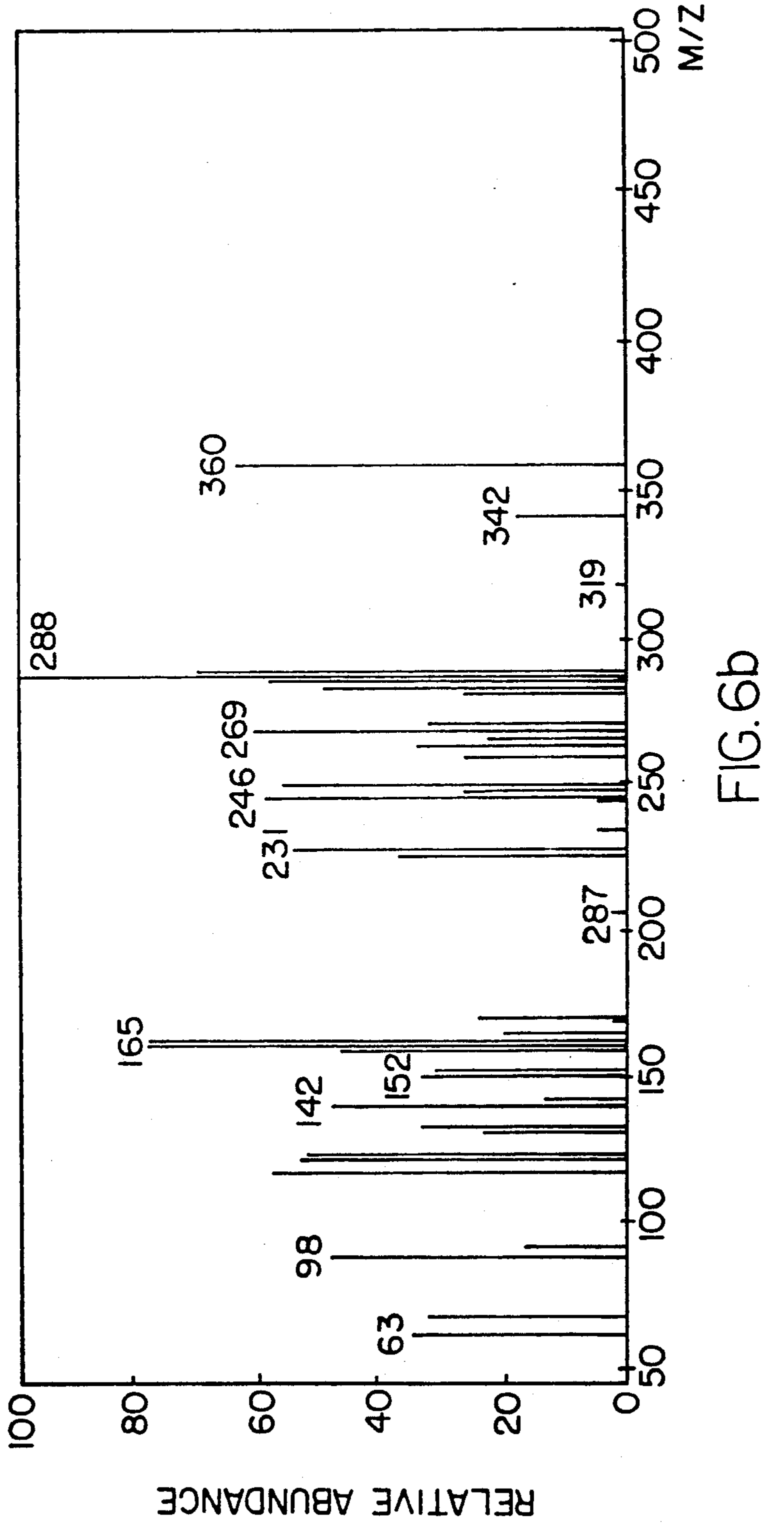

There was used a stainless steel needle rod having a diameter of 2 mm. As a cooling pipe there was used a stainless steel pipe, and pure water was used as a refrigerant. The results obtained are as shown in FIG. 6(*a*).

COMPARATIVE EXAMPLE 1

Using the conventional mass spectrometric apparatus provided with the ion source shown in FIG. 3, there was conducted the same measurement under the same conditions as in Example 1. The results are as shown in FIG. 6(*b*).

EXAMPLE 3

Figure 7A:
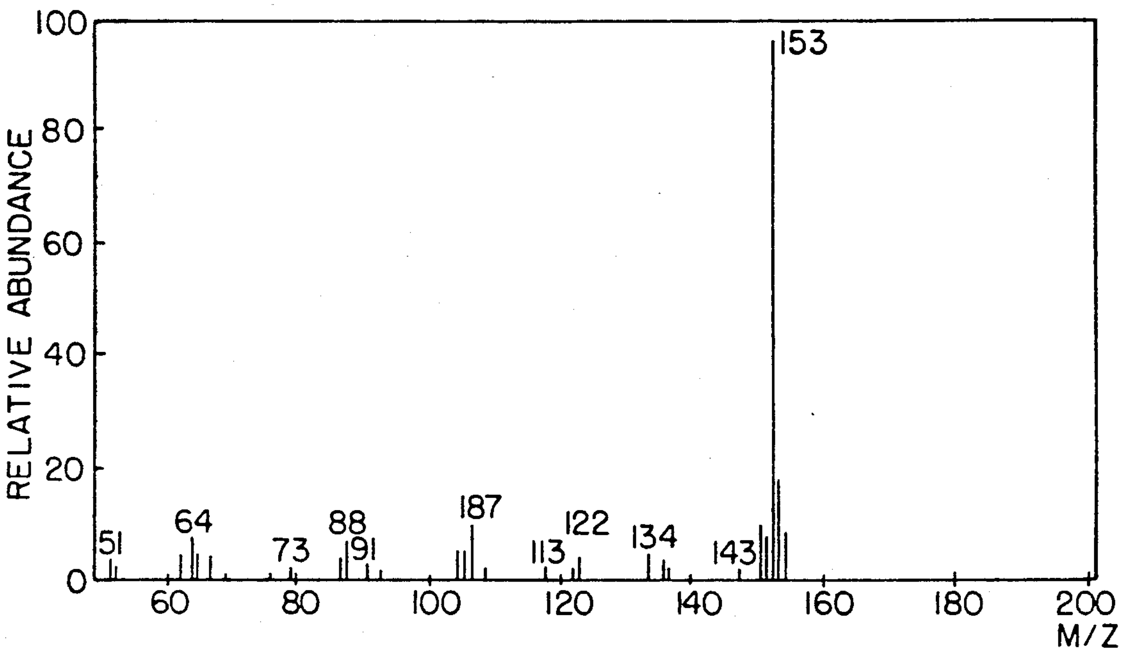
FIGS. 7(*a*) and (*b*) are mass spectrometric diagrams of metanitrobenzyl alcohol.
Figure 7B:
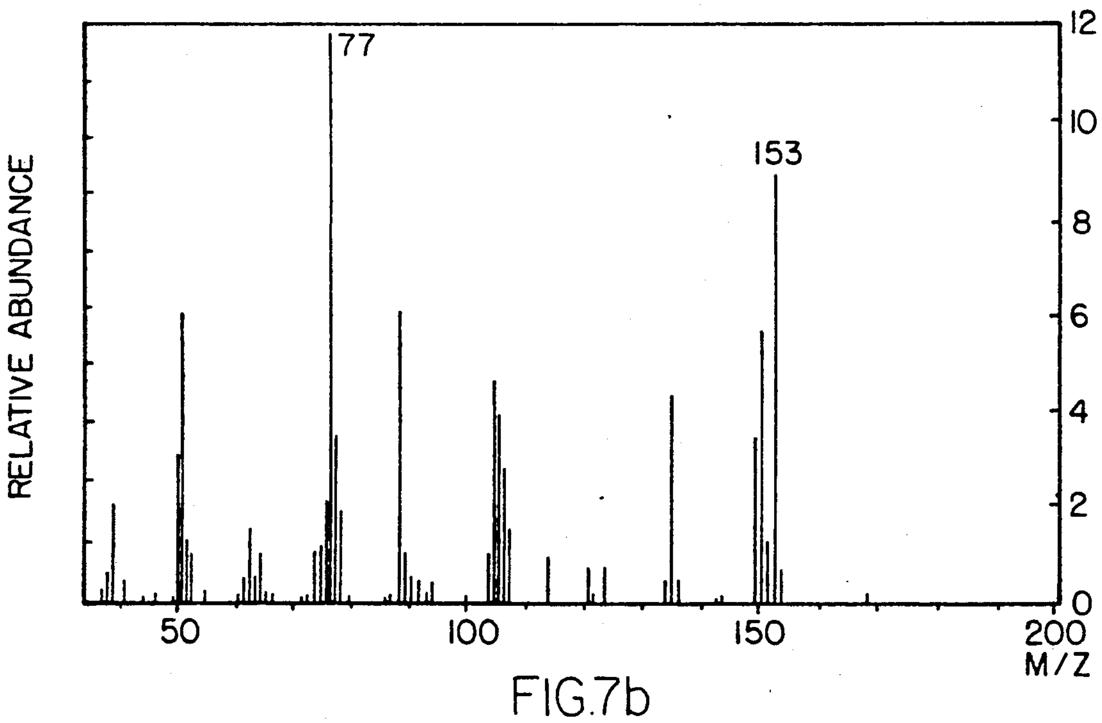

Under the same conditions as in Example 1 there was measured a spectrum of metanitrobenzyl alcohol. The results are as shown in FIG. 7(*a*).

COMPARATIVE EXAMPLE 2

Using the conventional mass spectrometric apparatus provided with the ion source illustrated in FIG. 3, there was conducted the same measurement under the same conditions as in Example 2. The results are as shown in FIG. 7(*b*).

As is apparent from the above results, according to the conventional method, the spectra are complicated and negative ions of parent molecules are not clear, so it is impossible to determine the mass and structure of each sample. On the other hand, according to the present invention, there are obtained clear spectra of negative ions of parent molecules and thus it is possible to attain the primary object of mass spectrometric analysis.

What is claimed is:

1. A Rydberg atom impact type ion source in a mass spectrometric apparatus wherein a gaseous sample molecule is impinged on Rydberg atom to ionize the sample and thus-ionized sample is subjected to mass spectrometric analysis, said ion source being characterized in that a needle rod is used in a Rydberg atom generating portion of an ion source block.

2. A Rydberg atom impact type ion source as set forth in claim 1, wherein said ion source block is equipped with a cooling means.

3. A Rydberg atom impact type ion source as set forth in claim 2, wherein said cooling means is disposed outside a Rydberg atom generating chamber.

4. A Rydberg atom impact type ion source as set forth in claim 2, wherein said cooling means comprises a hollow conduit and a refrigerant flowing through said hollow conduit.

* * * * *